United States Patent
Beriont et al.

(10) Patent No.: US 7,292,667 B1
(45) Date of Patent: Nov. 6, 2007

(54) METHOD AND SYSTEM FOR TRANSMITTING SYNCHRONIZATION INFORMATION WITH DATA

(75) Inventors: Walter Joseph Beriont, Lexington, MA (US); Mehmet Mustafa, Waltham, MA (US)

(73) Assignee: Verizon Laboratories Inc., Waltham, MA (US)

( * ) Notice: Subject to any disclaimer, the term of this patent is extended or adjusted under 35 U.S.C. 154(b) by 0 days.

(21) Appl. No.: 08/220,953

(22) Filed: Mar. 31, 1994

Related U.S. Application Data

(63) Continuation of application No. 07/815,456, filed on Dec. 31, 1991, which is a continuation-in-part of application No. 07/790,039, filed on Nov. 12, 1991.

(51) Int. Cl.
*H04L 7/00* (2006.01)
(52) U.S. Cl. ....................... 375/363; 375/365
(58) Field of Classification Search ............. 375/114, 375/112, 116, 122; 370/110.1, 111; 358/426, 358/261.1; 328/63, 72, 75; 348/384, 390
See application file for complete search history.

(56) References Cited

U.S. PATENT DOCUMENTS 4,161,719 A * 7/1979 Parikh et al. ............ 375/114 X
4,468,789 A * 8/1984 Groman ................. 375/122 X

FOREIGN PATENT DOCUMENTS

EP 0444 832 A2 2/1991

OTHER PUBLICATIONS

Block Codes for a Class of Constrained Noiseless Channels, D.T. Tang / L.R. Bahl, Aug. 8, 1969, IBM Research.*
European Patent Application, Publication # 0444 832 A2 Filing Date Feb. 22, 1991.*
D.T. Tang/L. R. Bahl, "Block Codes for a Class of Constrained Noiseless Channels", IBM Research (Aug. 1969).

* cited by examiner

Primary Examiner—William Luther
(74) Attorney, Agent, or Firm—Leonard C. Suchyta, Esq.; Joseph R. Palmieri, Esq.

(57) ABSTRACT

A method for transmitting synchronization information with data, which data corresponds to a sequence of samples representative of a signal, includes detecting the occurrence of two consecutive equivalent samples and inserting a synchronization pattern for the second-occurring sample prior to transmission. At a receiving end, the incoming signal is monitored to detect the presence of the sync pattern and hold the value of the receiver output at the value of the immediately previous received sample. In this manner, the signal is reconstructed without degradation, and byte synchronization information is sent without any bandwidth loss.

7 Claims, 2 Drawing Sheets

METHOD AND SYSTEM FOR TRANSMITTING SYNCHRONIZATION INFORMATION WITH DATA

CROSS REFERENCE TO RELATED APPLICATIONS

This application is a continuation-in-part of copending application entitled "TELEVISION RECEIVER FOR ACCESSING SWITCHED BROADBAND NETWORKS," Ser. No. 07/790,039, filed Nov. 12, 1991 by Walter Beriont, an inventor in this application, and assigned to the same assignee as the present application. The copending application is hereby incorporated by reference. This is a continuation of copending application Ser. No. 07/815,456 filed on Dec. 13, 1991.

FIELD OF THE INVENTION

The present invention relates to transmission systems and, more particularly, to the transmission of synchronization information with signal samples.

BACKGROUND OF THE INVENTION

In conventional transmission systems where analog signals such as video and audio information are prepared for digital transmission, the samples representing the analog signal are encoded as data bytes and then transmitted as a serial bit stream. The serial bit stream must then be converted back into bytes of data at the receiver to reconstruct the original samples. To correctly convert the serial bits to bytes, byte boundaries must be derived at the receiver. Byte boundaries are commonly identified by sending additional data that can uniquely mark the bit positions in a transmitted byte.

One conventional method of sending the additional byte sync information is via a unique symbol that can be distinguished from normal sample data and can be decoded to define byte boundaries. Disadvantageously, the unique symbol must be transmitted in place of valid data and will interrupt the continuity of a real time system. In real time video and audio systems, this discontinuity degrades the data reconstruction process and may cause unsightly specs in the video display or an annoying buzz in the audio.

OBJECT OF THE INVENTION

It is a principal object of the present invention to obviate the above-noted and other disadvantages of the prior art.

It is a further object of the present invention to transmit synchronization information with encoded data in real time.

It is a further object of the present invention to transmit byte synchronization information without any bandwidth loss.

It is a yet further object of the present invention to provide a system for performing a real time reconstruction of recovered data without suffering degradation.

SUMMARY OF THE INVENTION

In one aspect of the present invention, a method of transmitting an incoming sequence of signal samples and receiving the transmitted samples includes the step, for each of the incoming samples, of (i) transmitting the sample if the sample is not equivalent to an immediately preceding sample, or (ii) transmitting a synchronization pattern if the sample is equivalent to the immediately preceding sample. The method further includes the steps of monitoring the transmissions at a receiving end to detect the occurrence of the synchronization pattern, outputting a received sample when a synchronization pattern is not detected, and outputting the immediately previous received sample when a synchronization pattern is detected.

In another aspect of the present invention, a system for transmitting an incoming sequence of signal samples and receiving the transmitted samples includes transmit means for monitoring the sequence of signal samples, transmitting a sample if the sample is not equivalent to an immediately preceding sample, and transmitting a synchronization pattern if the sample is equivalent to the immediately preceding sample. A receive means, coupled to receive the transmission, outputs a received sample when a synchronization pattern is not detected, and outputs the immediately previous received sample when a synchronization pattern is detected.

BRIEF DESCRIPTION OF THE DRAWINGS

For a better understanding of the present invention, together with other objects, advantages and capabilities thereof, reference is made to the following Description and appended claims, together with the Drawings, in which:

DETAILED DESCRIPTION OF THE PREFERRED EMBODIMENTS

Figure 1:
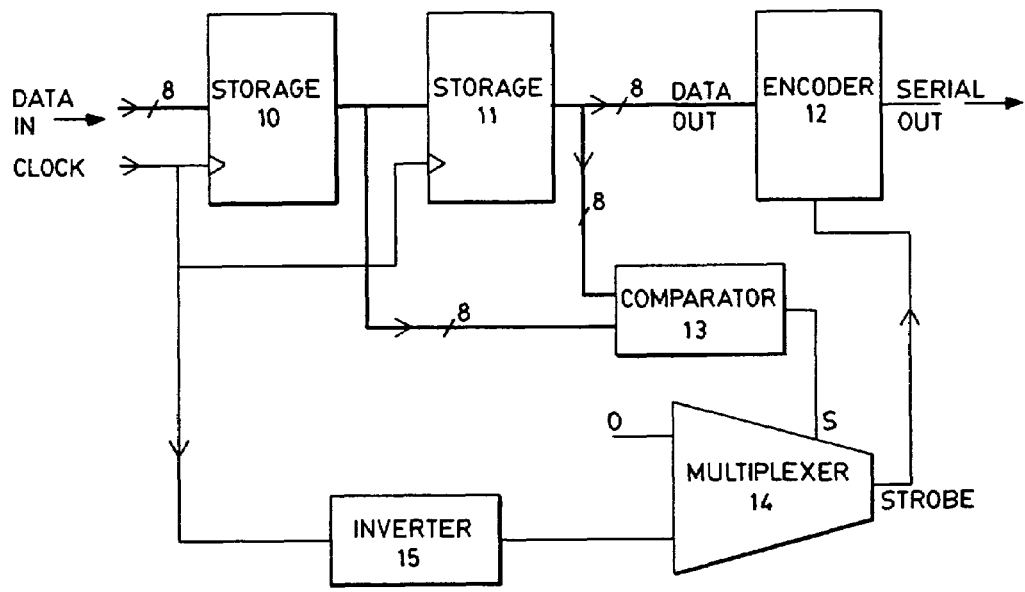
FIG. 1 is a circuit schematic of a transmitter in accordance with a preferred embodiment of the present invention.

The following embodiment is presented to enable those skilled in the art to more clearly understand and practice the present invention. However, this embodiment should not be considered as a limitation upon the scope of the present invention, but merely as being illustrative and representative thereof.

In order to eliminate the degradation mentioned above, sync bytes can be transmitted only when the interruption will not degrade the reconstruction process. In accordance with the present invention, the samples are monitored at the transmitting end to determine the proper conditions to insert sync information, and the previous sample is held as the receiver's output whenever sync information is detected at the receiving end. The condition for sending sync information must allow the use of one sample to simulate a second sample.

This is accomplished by checking for two consecutive equal data samples and sending sync information (sync byte) in place of the second equivalent sample. By requiring a sync byte to replace only equivalent data bytes, holding the previous sample value if sync is detected will simulate the recovery of the real time data at the receiver. Degradation will not be detected when the recovered data is used to reconstruct the samples.

The present invention is illustrated in the exemplary circuits and operational waveforms of FIGS. 1-4. As used herein, equivalence between two byte samples refers to identical bit patterns.

The analog signal from a representative information source, such as an audio/video system, is sampled and encoded into byte sequences. These byte sequences are coupled into the transmitter of FIG. 1 on the parallel DATA IN bus, and are clocked into a first storage register 10 at the rate of the CLOCK signal. A second storage register 11 is serially cascaded to register 10. As shown, the clock input of register 11 is also connected to the CLOCK signal so that register 11 is loaded with the contents of register 10 simultaneously with the loading of a byte signal into register 10 from the DATA IN bus. Accordingly, for the purpose of explanation, the synchronous response of registers 10 and 11 to the CLOCK signal results in a current sample being stored in register 11 and a next sample being stored in register 10.

An encoder 12 receives the parallel data from register 11 on a DATA OUT bus, and outputs data in a serial bit stream on a SERIAL OUT bus. Thus, encoder 12 serializes the parallel samples and encodes them for transmission. The encoder is responsive to an appropriate STROBE signal from a byte comparison module for inserting a synchronization pattern SYNC in the serial transmission appearing on the SERIAL OUT bus. The encoding should preferably provide facilities that recognition of special bit sequences can be done with relative certainty. In a specific embodiment of the present invention, a block coding of 4B/5B is used in which special sequences of bits are guaranteed not to occur in the mapping of the data.

The byte comparison module is comprised of an identity detector 13, a multiplexer (MUX) 14, and an inverter (INV) 15. Elements 10, 13, 14, and 15 are implemented with an EP610 Programmable Array Logic (PAL) chip, and elements 11 and 12 implemented with an AM7968 TAXI chip.

The detector monitors the outputs of storage registers 10 and 11 to determine whether the next sample byte to be loaded into register 11 (from register 10) is equivalent to the current byte in register 11 (which is being coupled at the DATA OUT bus to the encoder 12 for transmission). The detector 13 outputs a match signal when a match condition is satisfied, indicating the occurrence of two consecutive identical data bytes.

The multiplexer 14 is responsive to a control signal from detector 13 for selectively coupling either the inverted clock (from the inverter 15) or input 0 to the MUX output. When the match condition is not satisfied, the inverted clock signal appears as a STROBE signal from the MUX. However, when a match is detected by the detector 13, the multiplexer selects the 0 input, thereby blocking the inverted clock signal from appearing as the STROBE signal. Thus, the STROBE is inhibited whenever the next byte (from register 10) to be transmitted is identical to the byte (from register 11) currently being transmitted.

The serial encoder 12 is responsive to the presence of a data STROBE signal from the multiplexer 14 for serially transmitting the current and next sample bytes. However, when the encoder 12 detects the absence of a data STROBE at its control input, the encoder transmits the current byte and substitutes a SYNC bit pattern in the serial transmission stream for the next byte sample. Thus, the encoder maintains bit continuity by transmitting SYNC sequences whenever there is a missing data STROBE pulse.

Figure 2:
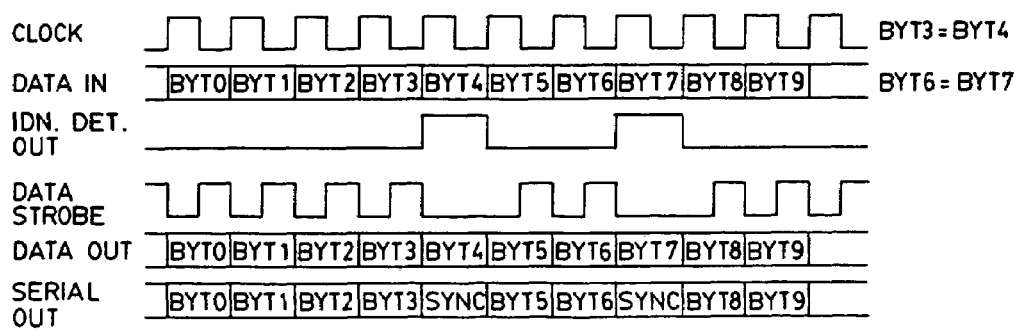
FIG. 2 is a series of exemplary waveforms for illustrating/ the operation of the circuitry in FIG. 1.

FIG. 2 shows a series of exemplary waveforms for illustrating the operation of the circuitry in FIG. 1. The clock rate is chosen to be compatible with the operating specifications of storage registers 10 and 11, and the data rate of the information on the DATA IN bus. The information on the DATA IN bus represents a portion of the encoded signals, and is shown as a series of byte samples BYT0-BYT9. For purposes of illustration, BYT3 is identical to BYT4, and BYT6 is identical to BYT7.

As detailed above with respect to the storage of adjacent byte samples in register 10 and 11, BYT4 is loaded into register 10 during the same clock period as BYT3 is being loaded into register 11. During the next clock period, BYT3 is coupled to the encoder 12 on the DATA OUT bus and BYT4 is loaded into register 11. The detector 13, being coupled to both the DATA OUT bus and an inter-register bus, detects the occurrence of a match condition and outputs a MATCH signal to the multiplexer. As explained above, the multiplexer 14 responds to the MATCH signal and inhibits the generation of the data STROBE during the clock period associated with the presence of BYT4 on the DATA OUT bus. The encoder detects the absence of the data STROBE, and substitutes the SYNC pattern for BYT4 in the serially transmitted bit stream on the SERIAL OUT bus. The circuitry operates similarly when BYT6 is identical to BYT7.

Figure 3:
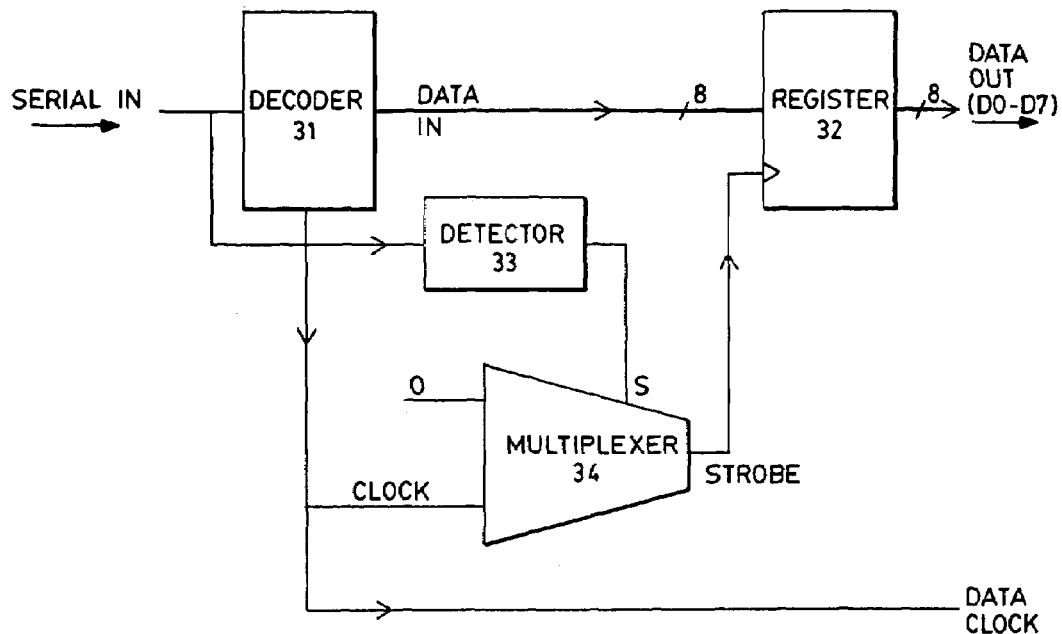
FIG. 3 is a circuit schematic of a receiver in accordance with a preferred embodiment of the present invention.

FIG. 3 is a schematic illustration of the circuitry for receiving the bit stream from the SERIAL OUT bus of FIG. 1, and converting the serial information back into data bytes for reconstructing the original samples.

The SERIAL OUT bus from FIG. 1 is connected through a suitable communication medium to the SERIAL IN bus of the receiver in FIG. 3. The communication medium may include a recording medium, but the present invention is particularly advantageous in a real-time transmission environment.

As explained above, the signal from the transmitter contains a SYNC bit sequence interspersed in an information bit stream. The function of the receiver is to reconstruct the original samples from the serial input stream, using the SYNC pattern to indicate byte boundaries. Accordingly, the receiver circuitry must be able to detect the SYNC pattern and insert the data byte which was replaced by the SYNC pattern during transmission.

The SERIAL IN bus is coupled into a serial decoder 31 which converts the serial input stream into parallel bytes appearing on a DATA IN bus. A register 32 outputs the parallel byte on the DATA IN bus in response to an appropriate STROBE signal from multiplexer (MUX) 34. The MUX selects either the CLOCK signal from decoder 31 or a low state signal to be the STROBE signal.

Since the receiver circuitry initially is not aware of the byte boundaries, the STROBE (clock signal) into register 32 does not necessarily align with the byte boundaries. However, once the sync detector 33 detects the presence of a SYNC pattern in the input bit stream on the SERIAL IN bus, the sync detector outputs an inhibiting signal. As shown, this SYNC detection is not simultaneous with the presence of a SYNC signal, but occurs partially into the SYNC byte. The MUX responds to the inhibiting signal and prevents the received CLOCK signal from strobing register 32. Thus, when the sync detector 32 indicates a match, the STROBE pulse (i.e., the CLOCK signal) is blocked from reaching register 32, causing register 32 to hold the DATA OUT at the prior value.

Figure 4:
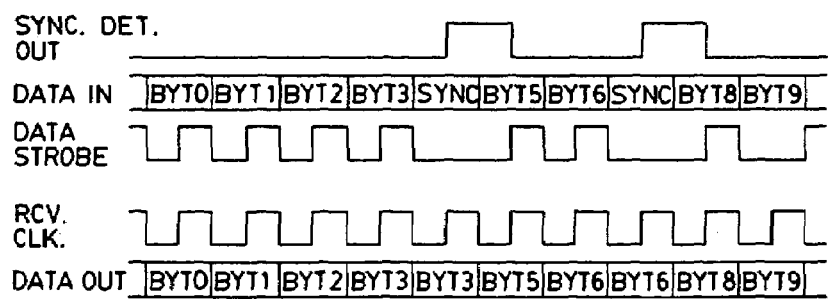
FIG. 4 is a series of exemplary waveforms for illustrating the operation of the receiver in FIG. 3.

The operation of the circuitry in FIG. 3 is readily understood with the exemplary set of waveforms shown in FIG. 4. During the bytes following the SYNC byte, the STROBE signal is issued with precise timing to latch bytes, on the DATA IN bus, into register 32. From this point on the information on the DATA OUT bus is in synchronism with the received clock labelled DATA CLOCK. It is clear that even when the STROBE signal is missing during a SYNC detection, the DATA CLOCK still appears.

Therefore, the contents of register 32 is read twice, once prior to the SYNC byte and then during the SYNC byte. The action of reading the contents of register 32 twice recreates the original BYT4 and BYT7 that were replaced by SYNC insertion during transmission. It must be noted here that after a byte SYNC is established, subsequent SYNC detections do not impose any data impairment or reduce system throughput.

An AM7969 chip, implementing elements 31 and 33, is used to receive the sample stream from the transmitter of FIG. 1, and generate the clock strobe signal. Elements 34 and 32 are implemented with an EP310 PAL.

The method and system described herein provide a solution to the problem of synchronizing byte boundaries of real time data without disrupting access to that data at the receiver. The invention is not restricted to video and audio data as described in the illustrative example above, but can be used in many systems where sync information can be transmitted on a conditional basis. The video/audio example facilitates an illustration of the advantages of the present invention.

While there has been shown and described what are at present considered the preferred embodiments of the invention, it will be obvious to those skilled in the art that various changes and modifications can be made therein without departing from the scope of the invention as defined by the appended Claims.

For example, although FIGS. 1-4 concern the serial transmission of sample and synchronization information, the invention is also applicable to systems which transmit ordered samples in other suitable formats so long as the samples can be compared and the sequential ordering can be ascertained at the receiver.

Furthermore, a variety of encoding schemes and clock and data rates are possible. The individual components in FIGS. 1 and 3 perform functions which may also be executed by equivalent circuitry known to those skilled in the art.

What is claimed is:

1. A method of preparing a sequence of consecutively ordered signal samples for transmission, wherein each signal sample is a digital representation of an analog signal quantity, comprising the step of:

for each occurrence of two consecutive identical samples in said sequence, replacing the second-occurring one of said two consecutive identical samples with synchronization information.

2. A method of transmitting an incoming sequence of signal samples, wherein each signal sample is a digital representation of an analog signal quantity, comprising the steps of:

for each of said incoming samples,
   (i) transmitting said incoming sample if said incoming sample is not identical to the sample which immediately precedes said incoming sample in said sequence, or
   (ii) transmitting a synchronization pattern if said incoming sample is identical to said preceding sample.

3. A method of incorporating synchronization information into an input stream of signal samples, wherein each signal sample is a digital representation of an analog signal quantity, comprising the steps of:

sequentially monitoring the samples in said input stream to detect a match condition characterized by an identically between two consecutive samples in said input stream;

if a match condition is detected, substituting the second-occurring identical sample with a synchronization pattern.

4. The method as recited in claim 3 wherein said substitution step occurs in real time.

5. A system for transmitting a sequence of signal samples received from an input bus, wherein each signal sample is a digital representation of an analog signal quantity, comprising:

storage means coupled to said input bus for temporarily storing samples;

sample comparison means coupled to said storage means for comparing each sample with the sample which immediately precedes said sample said sequence, and generating a match signal when said sample is identical to said preceding sample;

output means coupled to said storage means and said comparison means for transmitting each sample in the absence of a match signal, and transmitting a synchronization pattern in the presence of a match signal.

6. A method of transmitting an incoming sequence of signal samples and receiving the transmitted samples, wherein each signal sample is a digital representation of an analog signal quantity, comprising the steps of:

for each of said incoming samples,
   (i) transmitting said sample if said sample is not identical to the sample which immediately precedes said sample in said sequence, or
   (ii) transmitting a synchronization pattern if said sample is identical to said preceding sample;

monitoring said transmissions at a receiving end to detect the occurrence of said synchronization pattern; and outputting a received sample when a synchronization pattern is not detected, and outputting the immediately previous received sample when a synchronization pattern is detected.

7. A system for transmitting an incoming sequence of signal samples and receiving the transmitted samples, wherein each signal sample is a digital representation of an analog signal quantity, comprising:

transmit means for monitoring said sequence of signal samples, transmitting a sample if said sample is not identical to the sample which immediately precedes said sample in said sequence, and transmitting a synchronization pattern if said sample is identical to said preceding sample;

receive means, coupled to receive said transmission, for outputting a received sample when a synchronization pattern is not detected, and outputting the immediately previous received sample when a synchronization pattern is detected.

* * * * *